United States Patent
Bi et al.

(10) Patent No.: US 8,165,371 B2
(45) Date of Patent: Apr. 24, 2012

(54) ENHANCED CONTRAST MR SYSTEM ACCOMMODATING VESSEL DYNAMIC FLUID FLOW

(75) Inventors: Xiaoming Bi, Aurora, IL (US); Peter Schmitt, Weisendorf (DE); Renate Jerecic, Shanghai (CN); Peter Weale, Chicago, IL (US); Sven Zuehlsdorff, Chicago, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 509 days.

(21) Appl. No.: 12/436,917

(22) Filed: May 7, 2009

(65) Prior Publication Data
US 2010/0014735 A1   Jan. 21, 2010

Related U.S. Application Data

(60) Provisional application No. 61/082,394, filed on Jul. 21, 2008.

(51) Int. Cl.
*G06K 9/00* (2006.01)
(52) U.S. Cl. ......... 382/128; 382/131; 382/132; 600/410
(58) Field of Classification Search ............... 382/128, 382/132; 600/410, 413, 419; 703/2, 11
See application file for complete search history.

(56) References Cited

U.S. PATENT DOCUMENTS

| | | | |
|---|---|---|---|
| 6,845,260 B2 * | 1/2005 | Liu et al. | 600/410 |
| 7,739,090 B2 * | 6/2010 | Charbel et al. | 703/11 |
| 8,000,768 B2 * | 8/2011 | Zhao et al. | 600/410 |
| 2004/0039286 A1 * | 2/2004 | Kuban et al. | 600/467 |
| 2006/0047213 A1 * | 3/2006 | Gavriely et al. | 600/513 |

OTHER PUBLICATIONS

M. Essig, R. Engenhart, M.V. Knopp, M. Bock, J. Scharf, J. Debus, F. Wenz, H. Hawighorst, L.R. Schad, and G. Van Kaick, Cerebral Arteriovenous Malformations: Improved Nidus Demarcation by Means of Dynamic Taggginq MR-Angiography, 1996: vol. 14, No. 3; 227-233, Germany.

(Continued)

*Primary Examiner* — Joseph Chang
*Assistant Examiner* — Jeffrey Shin
(74) *Attorney, Agent, or Firm* — Alexander J Burke

(57) ABSTRACT

A system enhances MR imaging contrast between vessels containing dynamically flowing blood and static tissue using an MR imaging system. The MR imaging system, in response to a heart rate synchronization signal, acquires an anatomical preparation data set representing a spatially non-localized preparation 3D volume in response to a first magnetization preparation pulse sequence. The MR imaging system acquires a spatially localized anatomical imaging data set representing a second imaging volume. The MR imaging system subtracts slice specific MR imaging data of the spatially localized anatomical imaging data set from spatially and temporally corresponding slice specific imaging data of the anatomical preparation data set to derive blood flow indicative imaging data. The temporally corresponding slice specific imaging data comprises data acquired at a substantially corresponding cycle point within a heart beat cycle determined in response to said heart rate synchronization signal. The MR imaging system iteratively repeats the subtraction step for multiple adjacent slices individually comprising a spatially localized anatomical imaging data set to provide a three-dimensional imaging data set.

23 Claims, 7 Drawing Sheets

OTHER PUBLICATIONS

Frank R. Korosec, Richard Frayne, Thomas M. Grist, Charles Mistretta, Time-resolved contrast-enhanced 3D MR angiography. Magn Reson Med. 1996;36:345-51; Wisconsin.

Andrew V. Barger, Walter F. Block, Yuriy Toropov, Thomas M. Grist, Charles A. Mistretta, Time-resolved contrast-enhanced imaging with isotropic resolution and broad coverage using an undersampled 3D projection trajectory. Magn Reson Med. 2002;48:297-305, Wisconsin.

Christian Fink, MD, Sebastian Ley, MD, Randall Kroeker, PhD, Martin Requardt, PhD, Hans-Ulrich Kauczor, MD, and Michael Bock, PhD, Time-resolved contrast-enhanced three-dimensional magnetic resonance angiography of the chest: combination of parallel imaging with view sharing (TREAT). Invest Radiol. 2005;40:40-8, Germany.

Wyttenbach R, Braghetti A, Wyss M, Alerci M, Briner L, Santini P, Cozzi L, Di Valentino M, Katoh M, Marone C, Vock P, Gallino A. Renal artery assessment with non-enhanced steady-state free precession versus contrast-enhanced MR angiography. Radiology. 2007;245:186-95, Switzerland.

Kim WY, Dan Ias PG, Stuber M, Flamm SD, Plein S, Nagel E, Langerak SE, Weber OM, Pedersen EM, Schmidt M, Botnar RM, Manning WJ. Coronary magnetic resonance angiography for the detection of coronary stenoses. N Engl J Med. 2001;345:1863-9, Massachusettes.

Wedeen VJ, Meuli RA, Edelman RR, Geller SC, Frank LR, Brady TJ, Rosen BR. Projective imaging of pulsatile flow with magnetic resonance. Science. 1985;230:946-948.

* cited by examiner

10

ENHANCED CONTRAST MR SYSTEM ACCOMMODATING VESSEL DYNAMIC FLUID FLOW

This is a non-provisional application of provisional application Ser. No. 61/082,394 filed Jul. 21, 2008, by X. Bi et al.

FIELD OF THE INVENTION

This invention concerns a system for enhancing MR imaging contrast between vessels containing dynamically flowing blood and static tissue that substantially eliminates static tissue representative data from imaging data to provide an enhanced contrast vessel indicative image without use of a contrast agent based on blood flow into a slice during one or more heart beat cycle time increments.

BACKGROUND OF THE INVENTION

Cardiovascular disease is a leading cause of morbidity and mortality. Evaluation of vascular disease is a common indication of radiological examinations. Vascular imaging was first achieved through the use of conventional x-ray angiography. With the development of advanced imaging hardware and techniques in the past decades, the expectation for vascular imaging is not limited to visualization of stenosis or occlusion of blood vessel. Information concerning circulation or dynamic flow of blood to a particular anatomical region becomes more important for the diagnosis of diseases such as arterio-venous malformation (AVM) in the brain. X-ray angiography is currently widely used for diagnosis of various vascular pathologies and provides two-dimensional projection images of blood vessels with high spatial and temporal resolution. X-ray angiography however, is invasive and requires arterial catheterization. The formation of imaging contrast relies on administration of an iodinated contrast agent which may induce nephrotoxicity and further complications. Besides that, two-dimensional projection images make it difficult to visualize pathology from multiple viewpoints.

Computed tomography (CT) provides high spatial resolution 3D (three dimensional) image data sets over a short time duration. Oblique multiplanar reconstruction of the 3D image data sets is used to assess a vascular structure. However, temporal resolution of high spatial resolution CT 3D images is relatively poor and CT examinations typically require a relatively high radiation dose. Furthermore, use of a contrast agent is necessitated to generate adequate imaging contrast. Duplex ultrasonography is also used to provide an inexpensive and least harmful means for studying vascular structure. However, it is highly patient and operator dependent and the results are difficult to duplicate.

Magnetic resonance imaging (MRI) is a modality commonly used in routine clinical applications and provides good soft tissue contrast to differentiate normal and pathological structures. Imaging orientation and imaging contrast are freely manipulated by adjusting the imaging protocol and parameters. Neither ionizing radiation nor iodinated contrast agents are involved and MR images provide anatomical and functional information from the same imaging session. Contrast-enhanced magnetic resonance angiography (CE-MRA) is used in routine evaluation of vascular disease. Typically a Gadolinium-based contrast agent is intravenously injected. The shortening of blood longitudinal relaxation time ($T_1$) from such a paramagnetic agent yields enhanced blood signal intensity in resulting images. With appropriate setting of imaging parameters, high spatial resolution vascular images are acquired. A limitation of this technique is that, functional information is not well depicted due to relatively low temporal resolution (on the order of seconds) of acquired 3D image data compared to flow velocity of blood. Further, Nephrogenic Systemic Fibrosis (NSF), a systemic disorder potentially inducing devastating or even fatal functional consequences has been associated with Gadolinium-containing magnetic resonance contrast agents especially in patients with impaired renal function.

One known non-contrast agent blood flow imaging system discussed in a paper dated June 1995 by M Essig et al. entitled "Cerebral Arteriovenous Malformations: Improved Nidus Demarcation by Means of Dynamic Tagging MR-Angiography" employs a spatially localized tagging system. The known system limits tagged blood inflow to a ROI (region of interest) to flow from a spatially localized region associated with tagging pulse width and also only provides a 2D (two dimensional) imaging output. The known system also fails to provide comprehensive signal quality and speed characteristics desirable in this type of MR imaging. A system according to invention principles addresses these deficiencies and related problems.

SUMMARY OF THE INVENTION

An MR system provides a high temporal and spatial resolution three-dimensional (3D) image representative data set enabling visualizing dynamic blood flow in a single measurement without use of a contrast agent and advantageously showing blood inflow to a ROI from a spatially non-localized region using high quality and speed coherent (e.g., TrueFISP compatible) methods. A system enhances MR imaging contrast between vessels containing dynamically flowing blood and static tissue using an MR imaging system. The MR imaging system, in response to a heart rate synchronization signal, acquires an anatomical preparation data set representing a spatially non-localized preparation 3D volume in response to a first magnetization preparation pulse sequence. The MR imaging system acquires a spatially localized anatomical imaging data set representing a second imaging volume. The MR imaging system subtracts slice specific MR imaging data of the spatially localized anatomical imaging data set from spatially and temporally corresponding slice specific imaging data of the anatomical preparation data set to derive blood flow indicative imaging data. The temporally corresponding slice specific imaging data comprises data acquired at a substantially corresponding cycle point within a heart beat cycle determined in response to said heart rate synchronization signal. The MR imaging system iteratively repeats the subtraction step for multiple adjacent slices individually comprising a spatially localized anatomical imaging data set to provide a three-dimensional imaging data set. A display processor generates data representing at least one three dimensional display image presenting blood flow into a three dimensional imaging volume using the three-dimensional imaging data set.

DETAILED DESCRIPTION OF THE INVENTION

An MR system provides a high temporal and spatial resolution three-dimensional (3D) image representative data set advantageously enabling visualizing dynamic blood flow perpendicular to an imaging plane as well as within the plane in a single measurement without use of a contrast agent. The system advantageously shows blood inflow to a ROI from a spatially non-localized region using high quality and speed coherent (e.g., TrueFISP compatible) methods providing comprehensive signal quality and speed characteristics desirable in Angiographic MR imaging. The system in one embodiment uses a TrueFISP readout method offering relatively high SNR (signal to noise ratio) compared to previous FLASH (Fast Low Angle Shot Magnetic Resonance Imaging) sequences and in one example improves spatial resolution from 1.1×1×40.0 cubic mm voxel size to 1.3×1.3×1.3 cubic mm voxel size and improves temporal resolution from 150 msec to 50 msec (or lower). The system employs a spatially non-localized magnetization preparation pulse sequence (such as non-selective inversion or saturation) in a first imaging data set acquisition and employs a spatially localized magnetization preparation pulse sequence (such as selective-inversion or selective saturation), overlapped with (although not limited to) an imaging volume, in a second imaging data set acquisition. Blood inflow to a spatially localized region is visualized in subtracted images and is not limited by a tagging thickness e.g., associated with a tagging pulse width. Further, raw images before subtraction are used for T1 (inversion recovery time) quantification of a 3D imaging volume.

The system enables visualizing dynamic blood flow using magnetic resonance imaging (MRI). The morphological and functional flow information of blood vessels is advantageously evaluated in a single measurement without the need for contrast agent administration. High temporal and spatial resolution three-dimensional images are acquired in the same measurement with an advantageous imaging pulse sequence. Magnetization preparation is applied prior to time-resolved three-dimensional (3D) data acquisition. Neither ionizing radiation nor injection of contrast media is involved in the procedure. The measurement is readily performed or repeated in any desirable imaging orientation to study different diseases and pathology such as abnormal formation of blood vessel and other defects of the circulatory system.

Figure 1:
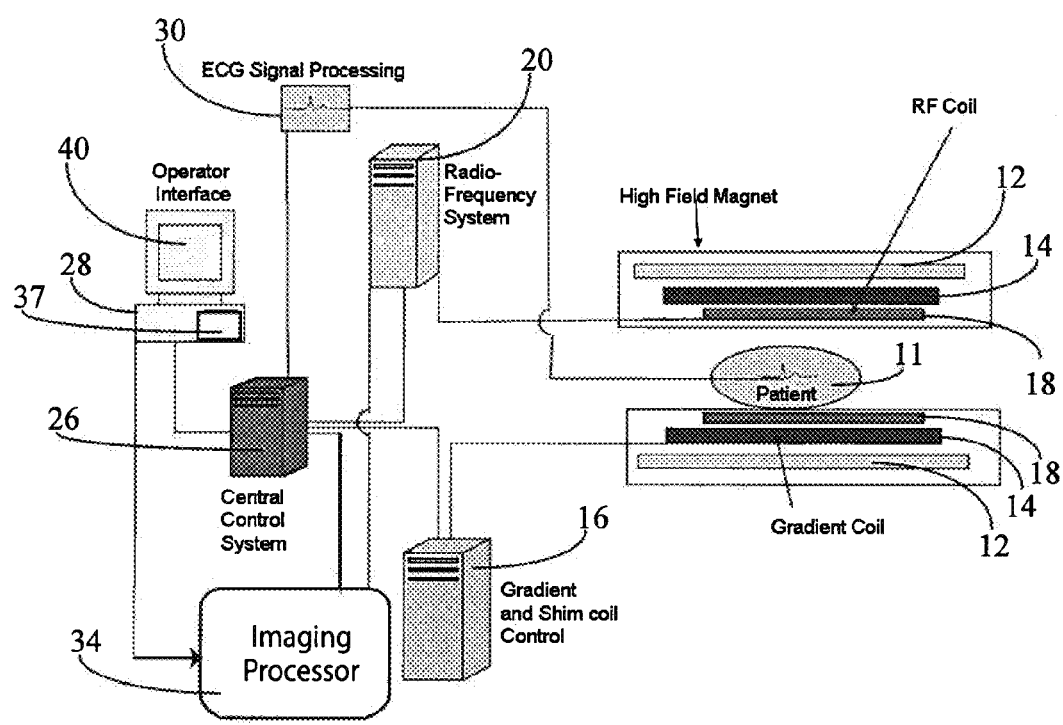
FIG. 1 shows a system for enhancing MR imaging contrast between vessels containing dynamically flowing blood and static tissue, according to invention principles.

FIG. 1 shows system 10 for enhancing MR imaging contrast between vessels containing dynamically flowing blood and static tissue using an advantageous MRI pulse sequence. System 10 employs an electrocardiography (ECG)-triggered or pulse triggered, segmented sequence to acquire time-resolved 3D images at different time delays after magnetization preparation (MP) pulses including non-spatially selective or spatially selective saturation and/or magnetization inversion pulses, for example. The system enables visualizing a vasculature structure as well as dynamic blood flow using high temporal and spatial resolution 3D MRI images eliminating a need for contrast agent. The morphological structure of vasculature and functional information of blood flow is evaluated in a single contrast agent free imaging scan using an advantageous MRI imaging pulse sequence. System 10 provides functional flow information depicted in 3D image sets with high temporal and spatial resolution and preserves high quality anatomical vasculature information without use of a contrast agent. The elimination of contrast agent removes associated risk and complications and advantageously makes it possible to repeat an imaging sequence as many times as necessary to identify pathologies from different imaging orientations and also simplifies preparation for an imaging examination by removing need for IV setup and reduces cost of examination. System 10 further improves temporal resolution from the order of a second to a millisecond, for example, assuming similar spatial resolution is used.

In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient module 16, produce position dependent magnetic field gradients in three orthogonal directions. The magnetic field gradients include a slice-selection gradient magnetic field, a phase-encoding gradient magnetic field and a readout gradient magnetic field that are applied to patient 11. Further RF (radio frequency) module 20 provides RF pulse signals to RF coil 18, which in response produces magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence controller 16 in conjunction with RF module 20 as directed by computer 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 to provide image representative data to image data processor 34. In system 10, in response to a heart rate synchronization signal provided by ECG synchronization signal generator 30, image data processor 34 acquires an anatomical preparation data set representing a spatially non-localized preparation 3D volume in response to a first magnetization preparation pulse sequence and acquires a spatially localized anatomical imaging data set representing a second imaging volume in response to a second magnetization preparation pulse sequence. The first magnetization preparation pulse sequence is non-slice specific and blood flow into the three dimensional anatomical volume is not limited to flow of blood from a slice determined by a tagging pulse duration. The first and second magnetization preparation pulse sequences are generated by units 16 and 20. Image data processor 34 subtracts slice specific MR imaging data of the spatially localized anatomical imaging data set from spatially and temporally corresponding slice specific imaging data of the anatomical preparation data set to derive blood flow indicative imaging data. The temporally corresponding slice specific imaging data comprises data acquired at a substantially corresponding cycle point within a heart beat cycle determined in response to the heart rate synchronization signal.

Processor 34 iteratively repeats the acquisition and subtraction steps for multiple adjacent slices individually comprising a spatially localized anatomical imaging data set to provide a three-dimensional imaging data set. Display processor 37 in computer 28 generates data representing at least one three dimensional display image presenting blood flow into a three dimensional imaging volume using the three-dimensional imaging data set. The three-dimensional imaging data set represents blood flow into a three dimensional anatomical volume perpendicular to an imaging plane.

Central control unit 26 uses information stored in an internal database comprising predetermined pulse sequence and strength data as well as data indicating timing, orientation and spatial volume of gradient magnetic fields to be applied in imaging and adjusts other parameters of system 10, so as to process the detected MR signals in a coordinated manner to generate high quality images of a selected slice (or slices) of the body. Generated images are presented on display 40. Computer 28 includes a graphical user interface (GUI) enabling user interaction with central controller 26 and enabling user modification of magnetic resonance imaging signals in substantially real time. Display processor 37 processes the magnetic resonance signals to provide image representative data for display on display 40, for example.

Figure 2:
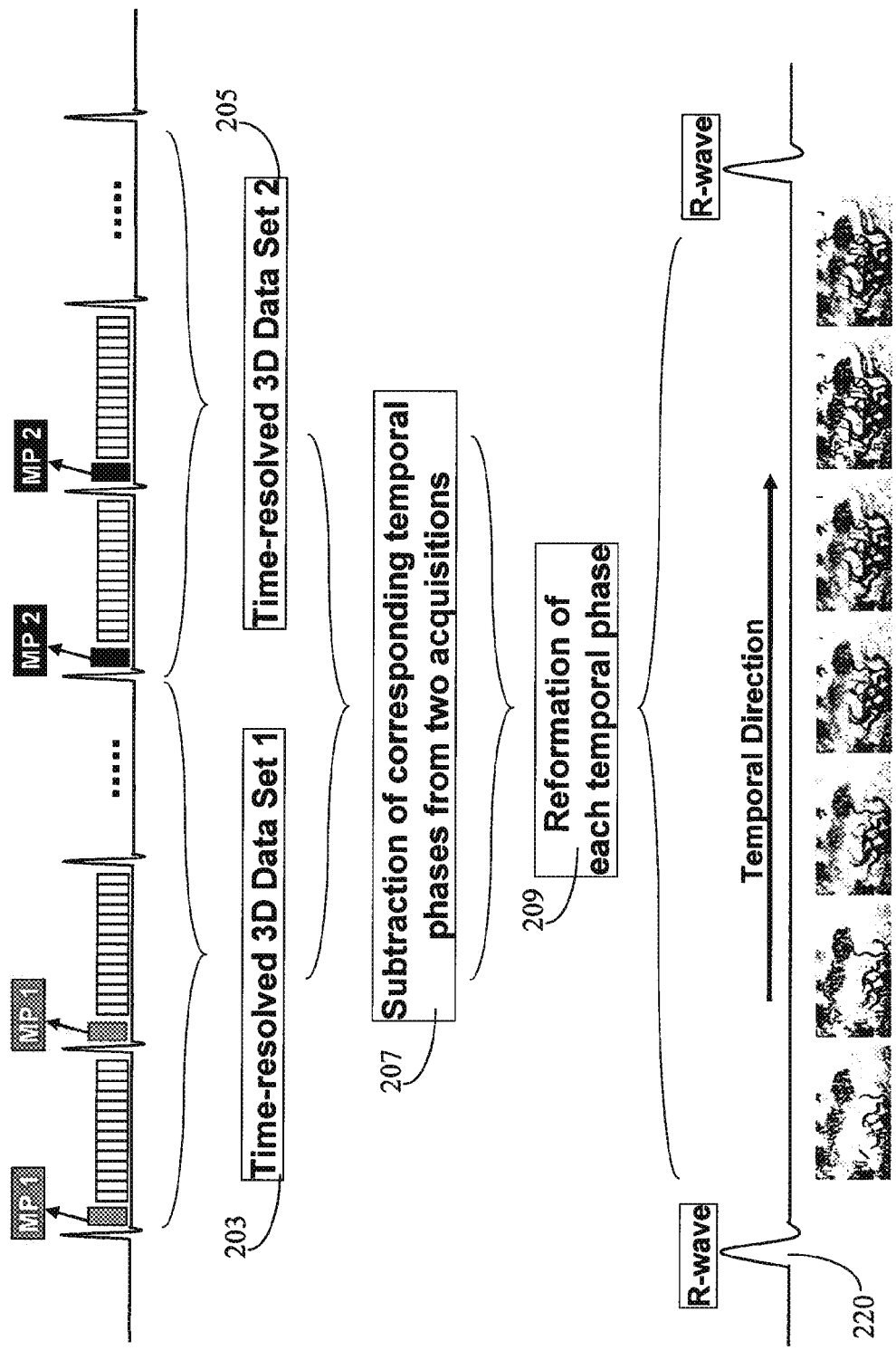
FIG. 2 shows a time-resolved, contrast agent-free, MR image acquisition and processing sequence of blood vessels, according to invention principles.

FIG. 2 illustrates operation of a first embodiment of the system and shows a time-resolved, contrast agent-free, MR image acquisition and processing pulse sequence for imaging blood vessels. Two acquisitions of the same 3D imaging volume are acquired in each measurement. In the first acquisition, a non-selective magnetization preparation pulse (MP 1) is triggered by the R-wave 220 of an ECG signal provided by unit 30 (FIG. 1). Following spatially non-localized MP 1, first spatially non-localized time-resolved 3D data set 203 is acquired by system 10 using interleaved, segmented sequence readout. Imaging data is acquired in numerous cardiac cycles. Multiple time-resolved 3D image sets (exemplified by 3D data set 203) are acquired with incremental inversion recovery time. Similarly, system 10 performs a second acquisition after the first acquisition in which the non-selective inversion pulse (MP 1) is replaced by a spatially localized slice-selective pulse (MP 2) to acquire second spatially localized time-resolved 3D data set 205. Corresponding temporal phases in the two acquisitions are subtracted in step 207 to provide blood flow indicative imaging data in step 209. Image data representing static tissues are substantially eliminated in subtracted images due to same magnetization recovery over time in both acquisitions. Fresh blood spins moving into the imaging slice, however, experience non-selective inversion (MP 1) and lead to high signal intensity in the subtracted images.

The length of visible blood vessels ($L_n$) for temporal phase n equals:

$$L_n = V \times TI_n \qquad \text{(Equation 1)}$$

Where V represents average blood flow velocity and $TI_n$ is the delay time between MP pulse and data readout for temporal phase n.

The temporal resolution ($T_{res}$) of the 3D data sets 203 and 205, or the time difference between the $n^{th}$ phase and $(n+1)^{th}$ phase, is determined by the repetition time (TR) of radiofrequency pulses and readout line acquired in one heart beat for each temporal phase ($N_{RO}$):

$$T_{res} = TI_{n+1} - TI_n = TR \times N_{RO} \qquad \text{(Equation 2)}$$

$N_{RO}$ are as low as 1, resulting in a highest possible temporal resolution of TR which is usually on the scale of 3 to 5 milliseconds. This is a significant improvement compared to known contrast-enhanced MRA methods in which temporal resolution is typically of the order of several seconds. Such high temporal resolution advantageously enables examination of dynamic information of fast flowing blood, for diagnosis of Arteriovenous malformations (AVM), for example, where flow velocity is too high to be diagnosed with conventional contrast enhanced magnetic resonance angiography methods.

Figure 3:
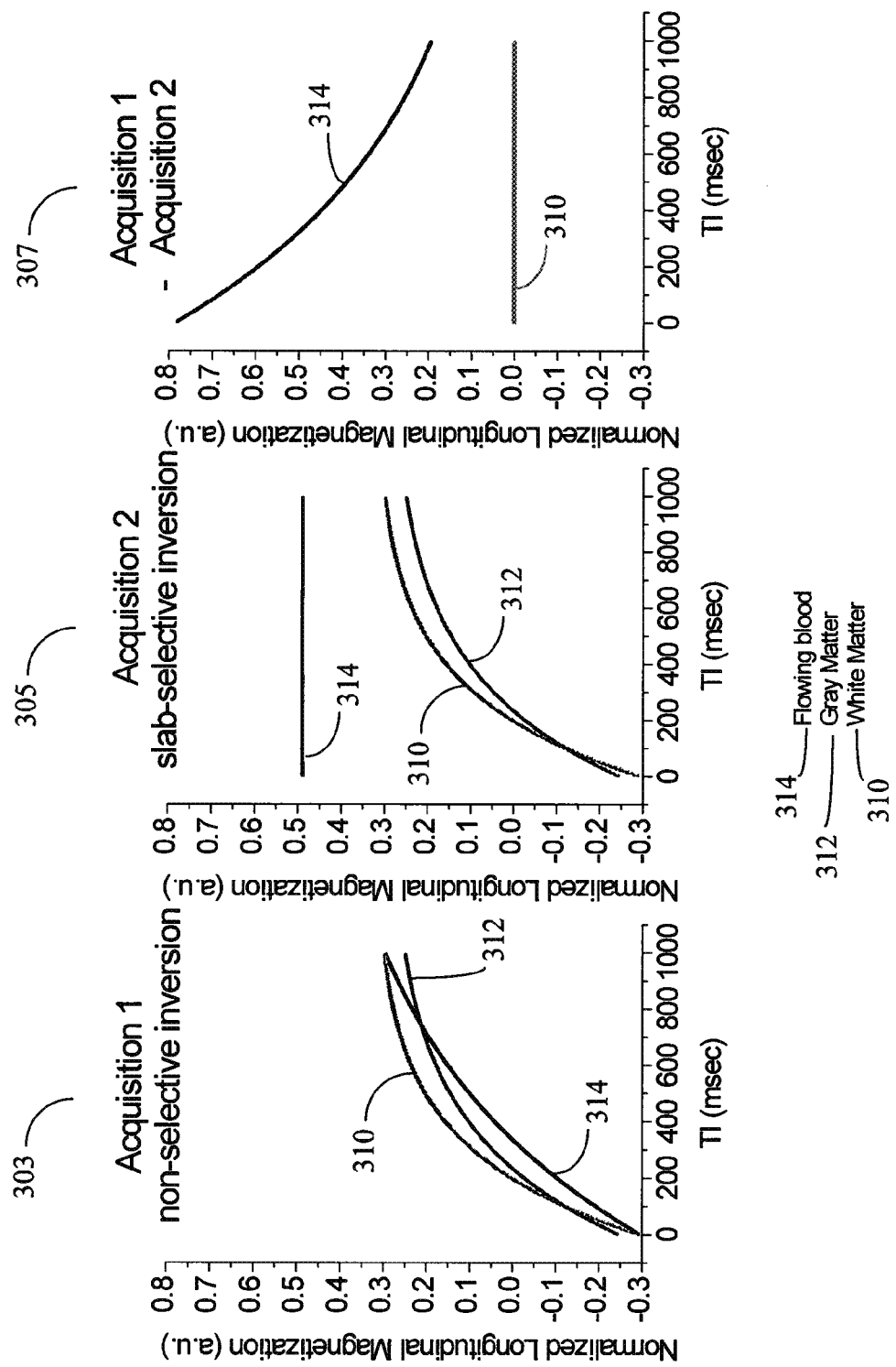
FIG. 3 shows simulated longitudinal magnetization in spatially non-localized and spatially localized image acquisition for static elements (gray matter, white matter) and moving elements (flowing blood) and showing image data subtraction results, according to invention principles.

FIG. 3 shows simulated longitudinal magnetization in spatially non-localized and spatially localized image acquisition for static elements (gray matter 312, white matter 310) and moving elements (flowing blood 314) and showing image data subtraction results. Magnetization recovers toward equilibrium after each magnetization preparation pulse (e.g., spatially non-localized inversion pulse and spatially localized slice-specific inversion pulse). As a result, signal intensities of static background tissues (e.g., gray matter, white matter for brain imaging) vary from one temporal phase to another. However, subtraction of the same temporal phases from two acquisitions eliminates such variation and results in substantially perfect suppression of static tissues. Moving spins (e.g., blood flow), on the other hand, experience only global preparation pulse (e.g., spatially non-localized inversion) and manifest as high luminance signal intensity in subtracted images. This is validated from numerical simulations.

Graphs 303 show normalized longitudinal magnetization plotted against T1 recovery time in curves 310 for white matter, 312 for gray matter and 314 for flowing blood derived from an imaging data set acquired using a spatially non-localized magnetization preparation pulse sequence. Graphs 305 show normalized longitudinal magnetization plotted against T1 recovery time in curves 310 for white matter, 312 for gray matter and 314 for flowing blood derived from an imaging data set acquired using a spatially localized slice-specific magnetization preparation pulse sequence. Graphs 307 show normalized longitudinal magnetization plotted against T1 recovery time in curve 314 for flowing blood and curve 310 (comprising a substantially zero magnetization value) for white matter following subtraction of slice specific MR imaging data associated with graphs 305 from spatially non-localized imaging data associated with graphs 303. Graphs 307 indicate substantial elimination of static background gray and white matter tissue regardless of differing relaxation properties from a resultant imaging data set leaving data representing dynamic flowing blood. Parameters used for the simulation to derive graphs 303, 305 and 307 include, balanced steady-state free precession (bSSFP) readout; TR/TE=3.6/1.8 msec; flip angle=50°. Tissue relaxation parameters: $T_{1,\ gray\ matter}/T_{2,\ gray\ matter}$=1086/95 msec; $T_{1,\ white\ matter}/T_{2,\ white\ matter}$=778/79 msec; $T_{1,\ blood}/T_{2,\ blood}$=1200/250 msec. TR (repetition time) is the amount of time that exists between successive pulse sequences applied to the same slice. TE (Echo Time) is the time in milliseconds between the application of a 90° pulse and the peak of the echo signal in Spin Echo and Inversion Recovery pulse sequences. Signals are extracted from a $5^{th}$ cardiac cycle when magnetization approximately reaches a steady state. Imperfection of slice profile is not taken into consideration in this simulation.

Figure 4:
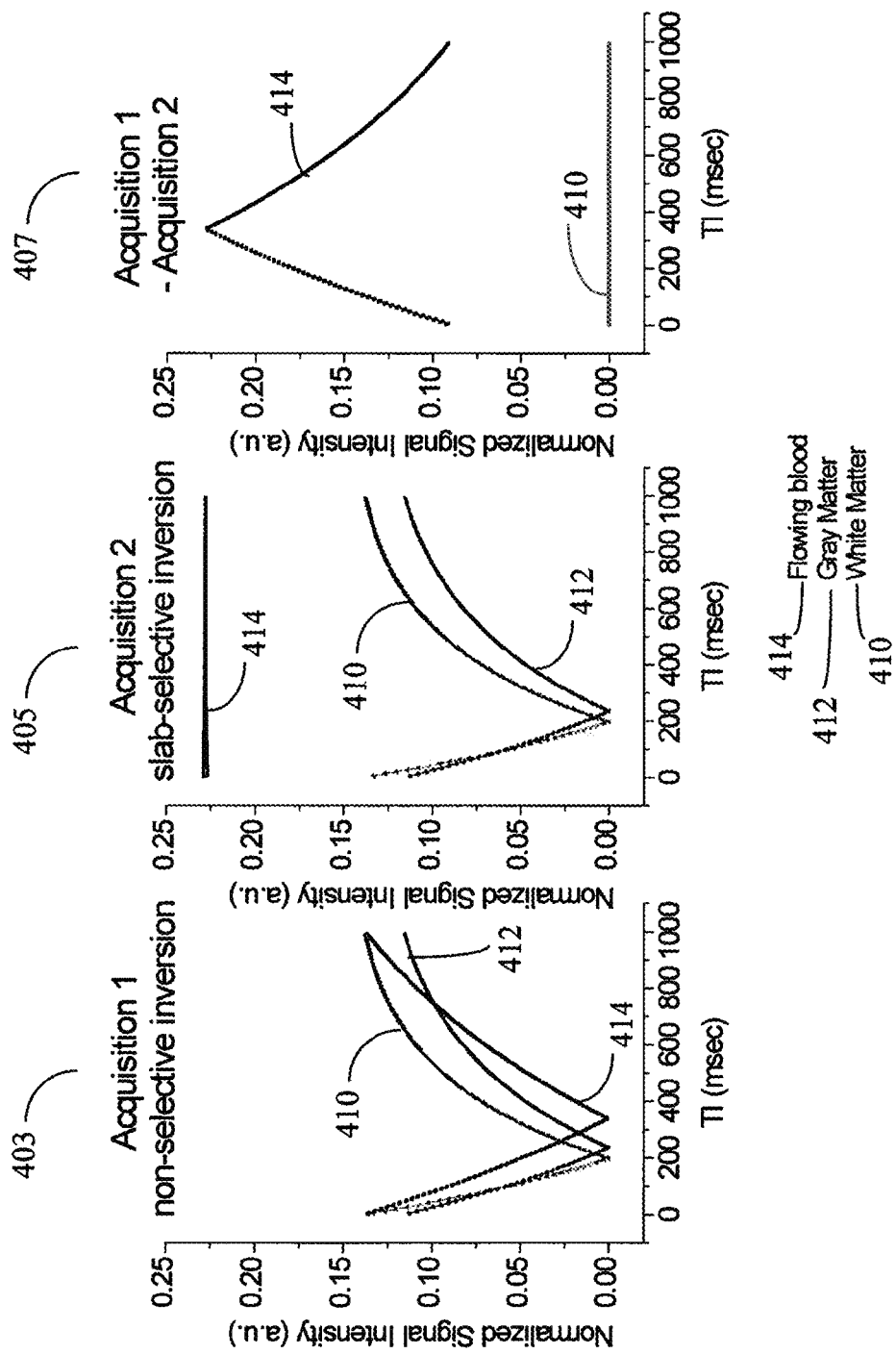
FIG. 4 shows simulated luminance signal intensity in spatially non-localized and spatially localized image acquisition for static elements (gray matter, white matter) and moving elements (flowing blood) and showing image data subtraction results, according to invention principles.

FIG. 4 shows simulated luminance signal intensity in spatially non-localized and spatially localized image acquisition for static elements (gray matter 412, white matter 410) and moving elements (flowing blood 414) and showing image data subtraction results. Graphs 403, 405 and 407 show simulated luminance signal intensity of flowing blood and static tissues (gray matter and white matter) plotted against T1 recovery time and demonstrate high luminance signal intensity of flowing blood through different temporal phases. Graphs 403, 405 and 407 indicate background signals from different types of static tissues (e.g. gray and white matter) are substantially suppressed in subtracted images.

Graphs 403 show normalized luminance signal intensity plotted against T1 recovery time in curves 410 for white matter, 412 for gray matter and 414 for flowing blood derived from an imaging data set acquired using a spatially non-localized magnetization preparation pulse sequence. Graphs 405 show normalized luminance signal intensity plotted against T1 recovery time in curves 410 for white matter, 412 for gray matter and 414 for flowing blood derived from an imaging data set acquired using a spatially localized slice-specific magnetization preparation pulse sequence. Graphs 407 show normalized luminance signal intensity plotted against T1 recovery time in curve 414 for flowing blood and curve 410 (comprising a substantially zero luminance intensity value) for white matter following subtraction of slice specific MR imaging data associated with graphs 405 from spatially non-localized imaging data associated with graphs 403. Graphs 407 indicate substantial elimination of static background gray and white matter tissue regardless of differing relaxation properties from a resultant imaging data set leaving data representing dynamic flowing blood in one measurement with predetermined settings. Parameters used for the simulation to derive graphs 403, 405 and 407 are the same as those used in the simulation of FIG. 3.

Figure 5:
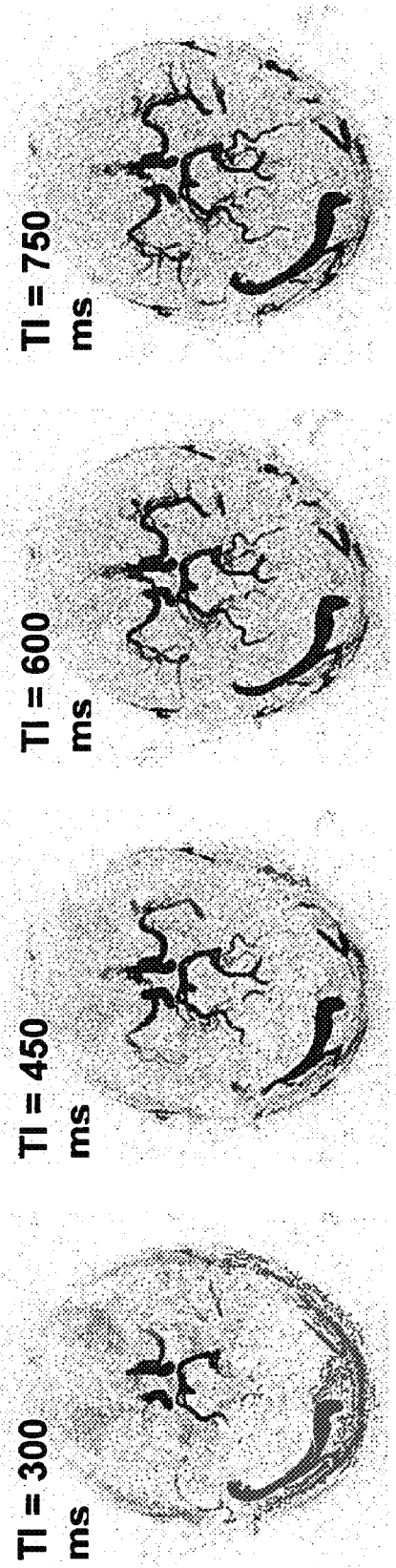
FIG. 5 illustrates images of the brain vasculature acquired from a healthy patient using a system according to invention principles.

FIG. 5 illustrates images of the brain vasculature acquired from a healthy patient using system 10 (FIG. 1) comprising a whole-body clinical image scanner, for example. The vasculature and dynamic inflow of blood are well depicted over time. For this case, the temporal resolution is 51.4 msec. Total imaging time is 5:35 with reconstructed spatial resolution of 0.6×0.6×1.5 mm³. Four images out of 16 phases are shown here with equidistance in the temporal dimension (recovery time TI of 150, 300, 450 and 600 ms respectively). The images comprise maximum-intensity-projection (MIP) images of time-resolved, 3D contrast agent free MR angiography from a healthy patient. For an individual temporal phase, subtraction is performed on 3D image pairs before performing MIP processing. Images are shown with inverted imaging contrast. Note that static background tissues are effectively suppressed in the temporal phases. The dynamic inflow of blood is well delineated over time.

Figure 6:
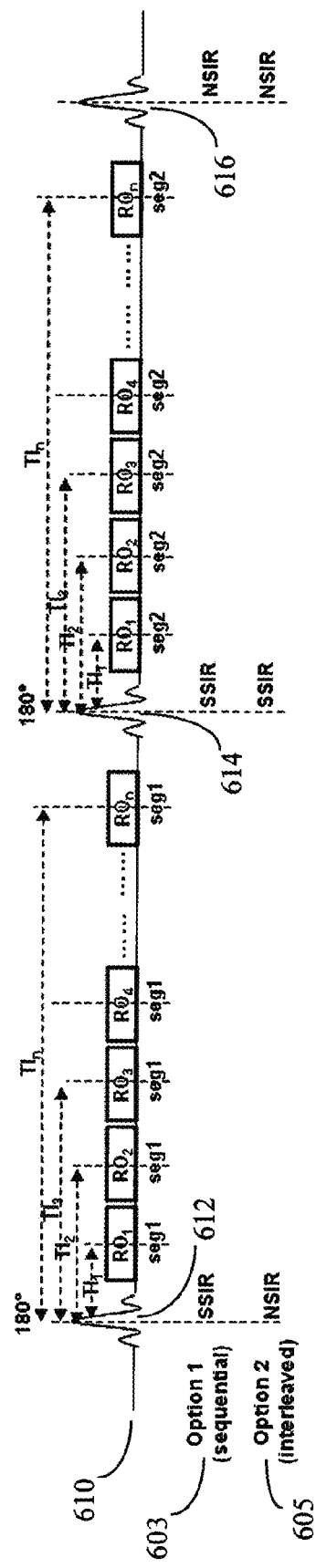
FIG. 6 shows contrast agent-free, MR image acquisition and processing using different pulse sequences involving selective and nonselective inversion for blood vessel imaging, according to invention principles.

FIG. 6 shows contrast agent-free, MR image acquisition and processing performed by system 10 (FIG. 1) using different pulse sequences involving spatially localized inversion and spatially non-localized inversion for blood vessel imaging. A first pulse sequence in row 603 involves a sequence of SSIR, SSIR and NSIR pulses although the system is not limited to inversion. Where SSIR comprises spatially localized slice selective inversion pulses and NSIR comprises spatially non-localized, non-selective inversion pulses. Thereby system 10 acquires multiple image datasets as represented in the pulse sequence 610. Specifically system 10 acquires multiple data segments individually comprising multiple k-space lines. Individual segment 1 is acquired after SSIR pulse 612 in response to multiple sequential data readout pulses (R0, R1 . . . Rn) having corresponding multiple different TI recovery times (TI0, TI1 . . . TIn). Individual segment 2 is acquired after SSIR pulse 614 in response to multiple sequential data readout pulses (R0, R1 . . . Rn) having corresponding multiple different TI recovery times (TI0, TI1 . . . TIn). Individual segments are similarly acquired after NSIR pulse 616. System 10 subtracts slice specific MR imaging data of a spatially localized anatomical imaging data set from spatially and temporally corresponding (having corresponding inversion recovery times) slice specific imaging data of another anatomical imaging data set acquired using a spatially non-localized magnetization preparation pulse sequence. Similarly, system 10, in a further embodiment employs a second interleaved pulse sequence indicated in row 605 involving a sequence of NSIR, SSIR and NSIR pulses. Thereby system 10 provides high temporal resolution as high as one readout line per 3 to 4 milli-seconds, for example, before such modification (a high bandwidth mode). K-space is temporary image space in which data from digitized MR signals are stored in the spatial frequency domain during data acquisition. When k-space is full (at the end of the scan), the data is mathematically processed to produce a final image. Thus k-space holds raw data before reconstruction.

Figure 7:
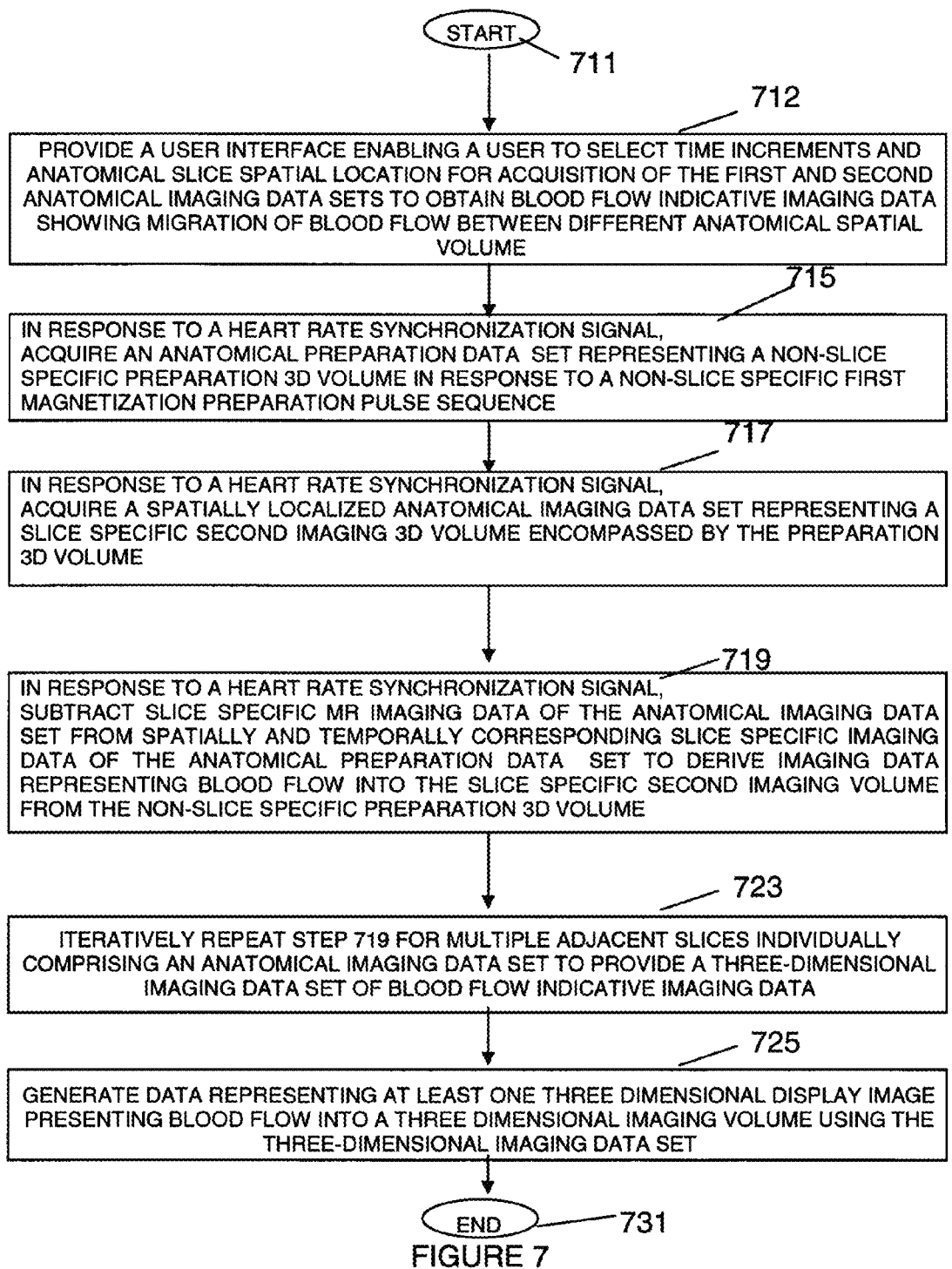
FIG. 7 shows a flowchart of process performed by a system for enhancing MR imaging contrast between vessels containing dynamically flowing blood and static tissue, according to invention principles.

FIG. 7 shows a flowchart of process performed by system 10 for enhancing MR imaging contrast between vessels containing dynamically flowing blood and static tissue. In step 712 following the start at step 711, a user interface (GUI and user entry device such as keyboard, mouse) provided by computer 28, enables a user to select time increments and anatomical slice spatial location for acquisition of first and anatomical imaging data sets to obtain blood flow indicative imaging data showing migration of blood flow between different anatomical spatial volumes. The user interface enables a user to select at least one of, (a) a sequence of particular time increments and (b) a sequence of anatomical slice spatial locations for acquisition of the first and anatomical imaging data sets to obtain blood flow indicative imaging data showing migration of blood flow between different anatomical spatial volumes.

In step 715, in response to a heart rate synchronization signal, MR imaging system 10 acquires an anatomical preparation data set representing a non-slice specific preparation 3D volume that is not determined by duration of a tagging pulse, in response to a non-slice specific first magnetization preparation pulse sequence. MR imaging system 10 uses the anatomical preparation data set for T1 relaxation time quantification of the three dimensional imaging volume. In step 717 in response to a heart rate synchronization signal, MR imaging system 10 acquires a spatially localized anatomical imaging data set representing a slice specific second imaging 3D volume encompassed by the preparation 3D volume. In one embodiment, this is performed in response to a slice specific second magnetization preparation pulse sequence and in another embodiment without such a second magnetization preparation pulse sequence. In one embodiment the preparation 3D volume at least partially encompasses the second imaging volume. In another embodiment, the preparation 3D volume is exclusive of the second imaging volume.

In step 719, in response to a heart rate synchronization signal, MR imaging system 10 subtracts slice specific MR imaging data of the anatomical imaging data set from spatially and temporally corresponding slice specific imaging data of the anatomical preparation data set to derive imaging data representing blood flow into the slice specific second imaging volume from the non-slice specific, spatially non-localized preparation 3D volume. The temporally corresponding slice specific imaging data comprises data acquired at a substantially similar cyclic point within a heart beat cycle determined in response to the heart rate synchronization signal. MR imaging system 10 acquires the first and anatomical imaging data sets and performs the subtracting step to derive blood flow indicative imaging data at increments throughout a heart beat cycle with increment temporal resolution of 100 milliseconds or less (increments throughout a heart beat cycle) for use in Angiography. The increment temporal resolution may in another embodiment comprise 10 milliseconds or less. MR imaging system 10, in subtracting slice specific MR imaging data of the anatomical imaging data set from spatially and temporally corresponding slice specific imaging data of the anatomical preparation data set, substantially eliminates static tissue representative data from the imaging data. Thereby system 10 provides an enhanced contrast vessel indicative image without use of a contrast agent based on blood flow into the slice during heart beat cycle time increments. In one embodiment, the blood flow indicative imaging data is reformatted using maximum-intensity-projection to visualize blood flow from different orientations. In a different embodiment, the blood flow indicative imaging data is reformatted using a post-processing function exclusive of maximum-intensity-projection to visualize blood flow from different orientations In one embodiment, at least one of, the first magnetization preparation pulse sequence and the second magnetization preparation pulse sequence are True fast imaging with steady state precession (TrueFISP) compatible sequences. True fast imaging with steady state precession (TrueFISP) is a coherent technique that uses a balanced gradient waveform. The image contrast with TrueFISP predominantly depends on TR (Repetition Time—the amount of time that exists between successive pulse sequences applied to the same slice). The speed and relative motion insensitivity of acquisition help to make the technique reliable even in patients who have difficulty with holding their breath.

In step 723, MR imaging system 10 iteratively repeats step 719 for multiple adjacent slices individually comprising an anatomical imaging data set to provide a three-dimensional imaging data set of blood flow indicative imaging data. The first magnetization preparation pulse sequence is non-slice specific and blood flow into the three dimensional anatomical volume is not limited to flow of blood from a slice determined by a tagging pulse duration. Further, the three-dimensional imaging data set represents blood flow into a three dimensional anatomical volume perpendicular to an imaging plane. In step 725, display processor 37 generates data representing at least one three dimensional display image presenting blood flow into a three dimensional imaging volume using the three-dimensional imaging data set. The process of FIG. 7 terminates at step 731.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-7 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The MR system provides a high temporal and spatial resolution three-dimensional (3D) anatomical volume image representative data set enabling visualizing dynamic blood flow perpendicular to an imaging plane as well as within the plane, without use of a contrast agent and without limit of blood flow into the three dimensional anatomical volume by a tagging pulse duration. Further, the processes and applications may, in alternative embodiments, be located on one or more (e.g., distributed) processing devices on the network of FIG. 1. Any of the functions and steps provided in FIGS. 1-7 may be implemented in hardware, software or a combination of both.

What is claimed is:

1. A system for enhancing MR imaging contrast between vessels containing dynamically flowing blood and static tissue, comprising:
   an MR imaging system for, in response to a heart rate synchronization signal,
   (a) acquiring an anatomical preparation data set representing a spatially non-localized first preparation 3D volume in response to a first magnetization preparation pulse sequence,
   (b) acquiring a spatially localized anatomical imaging data set representing an imaging 3D volume encompassed by said preparation 3D volume in response to a second magnetization preparation pulse sequence,
   (c) subtracting slice specific MR imaging data of said spatially localized anatomical imaging data set from spatially and temporally corresponding slice specific imaging data of said anatomical preparation data set to derive blood flow indicative imaging data, said temporally corresponding slice specific imaging data comprising data acquired at a substantially corresponding cyclic point within a heart beat cycle determined in response to said heart rate synchronization signal and
   (d) iteratively repeating step c for a plurality of adjacent slices individually comprising a spatially localized anatomical imaging data set to provide a three-dimensional imaging data set of blood flow indicative imaging data; and
   a display processor for generating data representing at least one three dimensional display image presenting blood flow into a three dimensional imaging volume using the three-dimensional imaging data set.

2. A system according to claim 1, wherein
said three-dimensional imaging data set represents blood flow into a three dimensional anatomical volume perpendicular to an imaging plane and
said first magnetization preparation pulse sequence is non-slice specific and blood flow into said three dimensional anatomical volume is not limited to flow of blood from a slice determined by a tagging pulse duration.

3. A system according to claim 1, wherein
said MR imaging system, in subtracting slice specific MR imaging data of said anatomical imaging data set from spatially and temporally corresponding slice specific imaging data of said anatomical preparation data set, substantially eliminates static tissue representative data from said imaging data to provide an enhanced contrast vessel indicative image without use of a contrast agent based on blood flow into said slice during a heart beat cycle time increment.

4. A system according to claim 1, wherein
said MR imaging system acquires the first and anatomical imaging data sets and performs the subtracting step to derive blood flow indicative imaging data at increments throughout a heart beat cycle with increment temporal resolution of 100 milliseconds or less.

5. A system according to claim 4, wherein
said increment temporal resolution comprises 10 milliseconds or less.

6. A system according to claim 1, wherein
said MR imaging system, subtracts slice specific MR imaging data of said anatomical imaging data set from spatially and temporally corresponding slice specific imaging data of said anatomical preparation data set over a user selected time increment of a heart beat cycle over a plurality of heart beat cycles to accumulate enhanced contrast vessel indicative imaging data over a plurality of corresponding time increments without use of a contrast agent based on blood flow into said slice during a heart beat cycle time increment and substantially eliminating static tissue representative data from said imaging data.

7. A system according to claim 1, including
a user interface enabling a user to select time increments and anatomical slice spatial location for acquisition of the first and anatomical imaging data sets to obtain blood flow indicative imaging data showing migration of blood flow between different anatomical spatial volumes.

8. A system according to claim 7, wherein
said user interface enables a user to select at least one of, (a) a sequence of particular time increments and (b) a sequence of anatomical slice spatial locations for acquisition of the first and anatomical imaging data sets to obtain blood flow indicative imaging data showing migration of blood flow between different anatomical spatial volumes.

9. A system according to claim 1, wherein
said MR imaging system acquires the first and anatomical imaging data sets and performs the subtracting step to derive blood flow indicative imaging data at increments throughout a heart beat cycle for use in Angiography.

10. A system according to claim 1, wherein
the blood flow indicative imaging data is reformatted using maximum-intensity-projection to visualize blood flow from different orientations.

11. A system according to claim 1, wherein
said MR imaging system acquires a spatially localized anatomical imaging data set representing a second imaging volume and
said preparation 3D volume is exclusive of said second imaging volume.

12. A system according to claim 1, wherein
said system enhances MR imaging contrast between anatomical structures other than vessels.

13. A system according to claim 1, wherein
said system enhances MR imaging contrast in anatomical structures containing dynamically flowing fluids.

14. A system according to claim 1, wherein
said MR imaging system acquires the first and anatomical imaging data sets and performs the subtracting step in response to an electrophysiological signal comprising an ECG signal.

15. A system according to claim 1, wherein
the blood flow indicative imaging data is reformatted using a post-processing function exclusive of maximum-intensity-projection to visualize blood flow from different orientations.

16. A system for enhancing MR imaging contrast between vessels containing dynamically flowing blood and static tissue, comprising:
   an MR imaging system for, in response to a heart rate synchronization signal,
   (a) acquiring an anatomical preparation data set representing a non-slice specific first preparation 3D volume in response to a non-slice specific first magnetization preparation pulse sequence,
   (b) acquiring a spatially localized 3D anatomical imaging data set representing a slice specific second imaging volume encompassed by said preparation 3D volume in response to a second magnetization preparation pulse sequence and (c) subtracting slice specific MR imaging data of said anatomical imaging data set from spatially and temporally corresponding slice specific imaging data of said anatomical preparation data set to derive imaging data representing blood flow into said slice specific second imaging volume from said non-slice specific preparation 3D volume, said temporally corresponding slice specific imaging data comprising data acquired at a substantially similar cyclic point within a heart beat cycle determined in response to said heart rate synchronization signal; and a display processor for generating data representing at least one display image presenting blood flow indicative image data derived by the subtraction.

17. A system according to claim 16, wherein
said non-slice specific preparation 3D volume is not determined by duration of a tagging pulse.

18. A system according to claim 16, wherein
said MR imaging system iteratively repeats step c for a plurality of adjacent slices individually comprising an anatomical imaging data set to provide a three-dimensional imaging data set of blood flow indicative imaging data and said display processor generates data representing at least one three dimensional display image presenting blood flow into a three dimensional imaging volume using the three-dimensional imaging data set.

19. A system according to claim 18, wherein
said anatomical preparation data set is used for T1 relaxation time quantification of the three dimensional imaging volume.

20. A system according to claim 18, wherein
at least one of, (a) said first magnetization preparation pulse sequence and (b) said second magnetization preparation pulse sequence are True fast imaging with steady state precession (TrueFISP) compatible sequences.

21. A system according to claim 16, wherein
said MR imaging system, in subtracting slice specific MR imaging data of said anatomical imaging data set from spatially and temporally corresponding slice specific imaging data of said anatomical preparation data set, substantially eliminates static tissue representative data from said imaging data to provide an enhanced contrast vessel indicative image without use of a contrast agent based on blood flow into said slice during a heart beat cycle time increment.

22. A method for enhancing MR imaging contrast between vessels containing dynamically flowing blood and static tissue, comprising the activities of:

in response to a heart rate synchronization signal,
(a) acquiring an anatomical preparation data set representing a non-slice specific preparation 3D volume in response to a non-slice specific first magnetization preparation pulse sequence,
(b) acquiring a spatially localized anatomical imaging data set representing a slice specific second imaging 3D volume encompassed by said preparation 3D volume in response to a second magnetization preparation pulse sequence,
(c) subtracting slice specific MR imaging data of said anatomical imaging data set from spatially and temporally corresponding slice specific imaging data of said anatomical preparation data set to derive imaging data representing blood flow into said slice specific second imaging volume from said non-slice specific preparation 3D volume, said temporally corresponding slice specific imaging data comprises data acquired at a substantially corresponding cyclic point within a heart beat cycle determined in response to said heart rate synchronization signal and
(d) iteratively repeating steps c for a plurality of adjacent slices individually comprising an anatomical imaging data set to provide a three-dimensional imaging data set of blood flow indicative imaging data; and generating data representing at least one three dimensional display image presenting blood flow into a three dimensional imaging volume using the three-dimensional imaging data set.

23. A method according to claim 22, wherein
blood flow into said three dimensional imaging volume is not limited to flow of blood from a slice determined by a tagging pulse duration.

\* \* \* \* \*